United States Patent
Ota et al.

(10) Patent No.: US 8,901,622 B2
(45) Date of Patent: Dec. 2, 2014

(54) SEMICONDUCTOR DEVICE AND METHOD FOR FABRICATING THE SAME

(75) Inventors: Chiharu Ota, Kanagawa (JP); Hiroshi Kono, Kanagawa (JP); Kazuto Takao, Ibaraki (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 797 days.

(21) Appl. No.: 13/038,803

(22) Filed: Mar. 2, 2011

(65) Prior Publication Data

US 2012/0056198 A1 Mar. 8, 2012

(30) Foreign Application Priority Data

Sep. 8, 2010 (JP) ................................. 2010-201452

(51) Int. Cl.
| | | |
|---|---|---|
| *H01L 29/80* | (2006.01) | |
| *H01L 31/112* | (2006.01) | |
| *H01L 23/62* | (2006.01) | |
| *H01L 29/06* | (2006.01) | |
| *H01L 29/16* | (2006.01) | |
| *H01L 29/868* | (2006.01) | |
| *H01L 29/872* | (2006.01) | |

(52) U.S. Cl.
CPC ........ *H01L 29/0615* (2013.01); *H01L 29/0619* (2013.01); *H01L 29/1608* (2013.01); *H01L 29/868* (2013.01); *H01L 29/872* (2013.01)
USPC .......................................... 257/256; 257/328

(58) Field of Classification Search
CPC ............ H01L 29/66143; H01L 29/872; H01L 29/7806; H01L 29/1608; H01L 29/861; H01L 27/2409
USPC .................. 257/256–287, 328–346, E29.262, 257/E21.09
See application file for complete search history.

(56) References Cited

U.S. PATENT DOCUMENTS

| | | | |
|---|---|---|---|
| 8,106,487 B2* | 1/2012 | Soendker et al. | 257/632 |
| 8,344,448 B2* | 1/2013 | Grover | 257/328 |
| 2008/0121807 A1* | 5/2008 | Valvo et al. | 250/370.07 |

FOREIGN PATENT DOCUMENTS

| | | |
|---|---|---|
| JP | 2002-299643 | 10/2002 |
| JP | 2007-281231 A | 10/2007 |

OTHER PUBLICATIONS

Japanese Office Action Issued Sep. 4, 2012 in Patent Application No. 2010-201452 (with English translation).

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A semiconductor device according to an embodiment includes a semiconductor substrate of a first conductivity type, a first semiconductor layer of the first conductivity type, a first semiconductor region of a second conductivity type, a second semiconductor region of the second conductivity type, a first electrode and a second electrode. The first semiconductor region is formed on at least a part of the first semiconductor layer formed on the semiconductor substrate. The second semiconductor region is formed on another part of the first semiconductor layer to reach an inside of the first semiconductor layer and having an impurity concentration higher than that of the first semiconductor region. The first electrode is formed on the second semiconductor region and a third semiconductor regions formed in a part of the first semiconductor region. The second electrode is formed to be in contact with a rear surface of the semiconductor substrate.

16 Claims, 6 Drawing Sheets

SEMICONDUCTOR DEVICE AND METHOD FOR FABRICATING THE SAME

CROSS-REFERENCE TO RELATED APPLICATION

This application is based upon and claims the benefit of priority from Japanese Patent Application No. 2010-201452 filed on Sep. 8, 2010 in Japan, the entire contents of which are incorporated herein by reference.

FIELD

Embodiments described herein relate generally to a semiconductor device and a method for fabricating the semiconductor device.

BACKGROUND

A silicon carbide (SiC) power semiconductor device is formed on, for example, a solid-state single-crystal SiC substrate. As the semiconductor device, a PiN/SBD (Schottky barrier diode) mixed diode is formed. A structure of a conventional PiN/SBD mixed diode is as follows. On a surface of a high-concentration n-type ($n^+$) silicon carbide (SiC) substrate, a low-concentration n-type ($n^-$) SiC epitaxial growth layer is formed. A high-concentration p-type ($p^+$) SiC region is formed in a part of a surface of the ($n^-$) SiC epitaxial growth layer. An anode electrode configuring an ohmic junction is formed in the ($p^+$) SiC region, and an anode electrode configuring a Schottky junction is formed on an exposed surface of the ($n^-$) SiC epitaxial growth layer except for the ($p^+$) SiC region. A cathode electrode configuring an ohmic junction is formed on a rear surface of the ($n^+$) SiC substrate. In the diode, longitudinal transfer of a current between a front surface (upper surface) of the substrate and a back surface (lower or rear surface) of the substrate is used.

In a forward direction in the diode, a current begins to flow when a voltage equal to or higher than an ON voltage determined by a Schottky barrier determined by a work function difference between a semiconductor and a Schottky electrode is applied due to contribution of a Schottky junction portion. A backward direction functions such that a backward leakage current is suppressed by a depletion layer spreading from a ($p^+$) SiC portion of a PN diode to an ($n^-$) SiC epitaxial growth layer due to contribution of an ohmic junction portion.

The Schottky portion of the SiC device is formed by an electrode material which is Schottky-jointed between an n-type semiconductor layer and an n-type semiconductor layer. Depending on a height of Schottky barrier determined by the electrode material and a heat treatment temperature, a voltage at which a current in application of a forward voltage begins to flow is determined. However, a wide-band-gap semiconductor such as SiC has a work function higher than that of silicon (Si) used as a power device semiconductor material, and even a Schottky barrier diode has a relatively high barrier, which is a problem. When the Schottky barrier is high, an ON voltage in application of a forward voltage increases to increase a loss in energization. Furthermore, since the Schottky barrier is uniquely determined by a semiconductor material, an electrode material, and a heat treatment temperature, as long as the same material or the like is used, a desired Schottky barrier cannot be freely formed.

For this reason, various electrode materials are examined, and data is provided such that a height of the Schottky barrier can be selected in a wider range. However, a Schottky barrier having a desired height is not always obtained. Furthermore, as another problem, a decrease in barrier height for lowering ON voltage is not sufficiently examined. When a barrier height is decreased in consideration of only forward characteristics, a backward current, i.e., a leakage current also easily flows in application of a backward voltage, and the basic characteristics of a diode are not satisfied.

DETAILED DESCRIPTION

First Embodiment

A semiconductor device according to an embodiment includes a semiconductor substrate of a first conductivity type, a first semiconductor layer of the first conductivity type, a first semiconductor region of a second conductivity type, a second semiconductor region of the second conductivity type, a third semiconductor region, a first electrode and a second electrode. The first semiconductor layer of the first conductivity type is formed on the semiconductor substrate. The first semiconductor region of a second conductivity type is selectively formed on at least apart of the first semiconductor layer. The second semiconductor region of the second conductivity type is selectively formed on another part of the first semiconductor layer to reach an inside of the first semiconductor layer and having an impurity concentration higher than that of the first semiconductor region. The third semiconductor region is selectively formed in apart of the first semiconductor region to range from a surface of the first semiconductor region to an inside of the first semiconductor region. The first electrode is selectively formed on the second and third semiconductor regions. The second electrode is formed to be in contact with a rear surface of the semiconductor substrate.

A method for fabricating a semiconductor device according to an embodiment includes forming a first semiconductor layer of a first conductivity type by epitaxial growth on a semiconductor substrate of the first conductivity type; forming a second semiconductor layer of a second conductivity type on the first semiconductor layer; implanting impurity ions from a part of surface of the second semiconductor layer to reach an inside of the first semiconductor layer to form a first semiconductor region of the second conductivity type in a region of the second semiconductor layer in which the impurity ions are not implanted and a second semiconductor region of the second conductivity type in a region of the first and second semiconductor layers in which the impurity ions are implanted, having an impurity concentration higher than that of the first semiconductor region; forming a first electrode on a part of the first semiconductor region and the second semiconductor region; and forming a second electrode on a rear surface of the semiconductor substrate.

A first embodiment will be described below with reference to the accompanying drawings. The following embodiment will be explained while a first conductivity type and a second conductivity type are defined as an n-type and a p-type, respectively.

Figure 1:
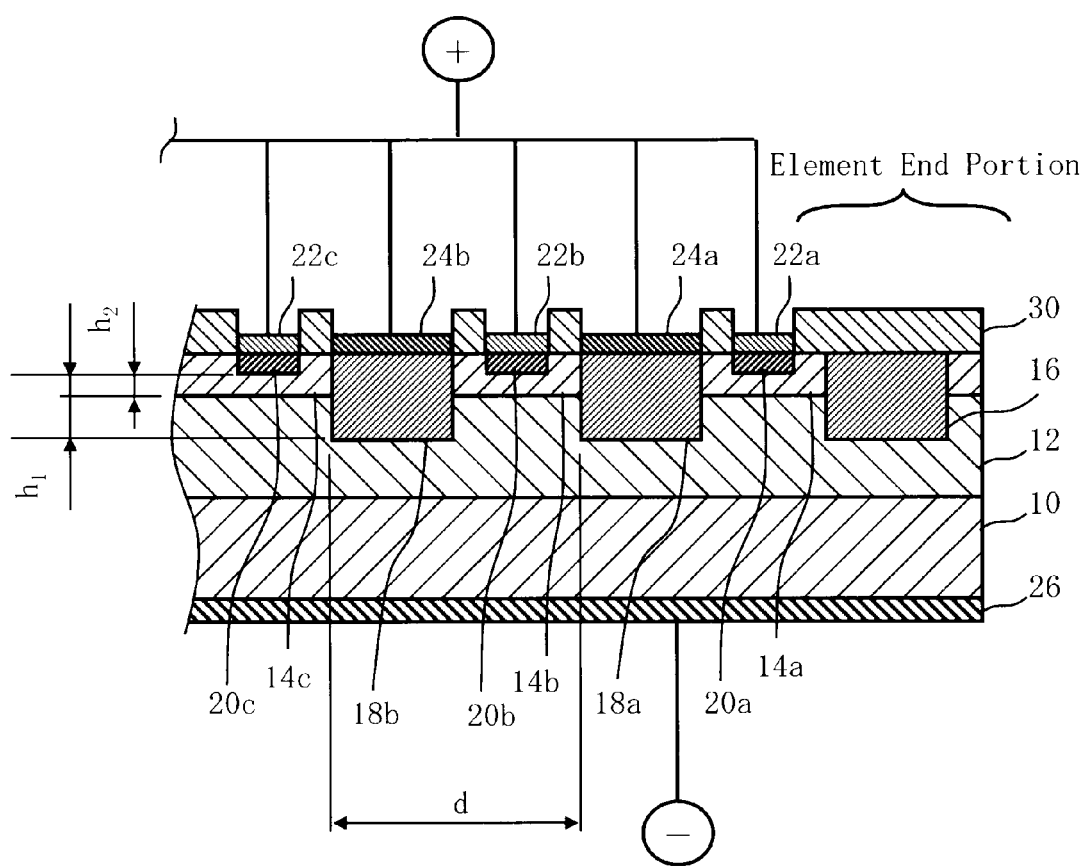
FIG. 1 is a diagram showing a configuration of a semiconductor device according to a first embodiment.

In FIG. 1, a low-concentration n-type (n) SiC semiconductor layer 12 is formed and arranged on a surface (front surface) of a high-concentration n-type ($n^+$) silicon carbide (SiC) semiconductor substrate 10. The ($n^-$) SiC semiconductor layer 12 is formed to have an impurity concentration lower than that of the ($n^+$) SiC semiconductor substrate 10. The ($n^+$) SiC semiconductor substrate 10 is an example of a semiconductor substrate of a first conductivity type. The ($n^-$) SiC semiconductor layer 12 is an example of a first semiconductor layer of the first conductivity type.

A low-concentration p-type ($p^-$) SiC semiconductor region 14 having a predetermined thickness is selectively formed and arranged on a part of the surface of the ($n^-$) SiC semiconductor layer 12. The ($p^-$) SiC semiconductor region 14 is an example of a first semiconductor region of a second conductivity type. A high-concentration p-type ($p^+$) SiC semiconductor region 18 is selectively formed and arranged on another part on the surface of the ($n^-$) SiC semiconductor layer 12 to reach an inside of the ($n^-$) SiC semiconductor layer 12. The ($p^+$) SiC semiconductor region 18 is an example of a second semiconductor region of the second conductivity type. Each of the ($p^+$) SiC semiconductor regions 18 is arranged from a predetermined-level position above the surface of the ($n^-$) SiC semiconductor layer 12 to a halfway position in the ($n^-$) SiC semiconductor layer 12. In the example of FIG. 1, an upper surface of the ($p^-$) SiC semiconductor region 14 and an upper surface of the ($p^+$) SiC semiconductor region 18 are formed at the same level. FIG. 1 shows an example in which the ($p^+$) SiC semiconductor region 18 is arranged in a region other than a region where the ($p^-$) SiC semiconductor region 14 is arranged on the ($n^-$) SiC semiconductor layer 12 and an element end portion. The ($p^+$) SiC semiconductor region 18 is formed to have an impurity concentration higher than that of the ($p^-$) SiC semiconductor region 14. In the example of FIG. 1, the ($p^+$) SiC semiconductor region 18 and the ($p^-$) SiC semiconductor region 14 are alternately and repeatedly arranged on the section of the semiconductor device. In the example of FIG. 1, a ($p^+$) SiC semiconductor region 18a is arranged next to a ($p^-$) SiC semiconductor region 14a, a ($p^-$) SiC semiconductor region 14b is arranged next to the ($p^+$) SiC semiconductor region 18a, a ($p^+$) SiC semiconductor region 18b is arranged next to the ($p^-$) SiC semiconductor region 14b, and a ($p^-$) SiC semiconductor region 14c is arranged next to the ($p^+$) SiC semiconductor region 18b. Although the three ($p^-$) SiC semiconductor regions 14 and the two ($p^+$) SiC semiconductor regions 18 are described here, the number of each semiconductor region is not limited to these numbers. A larger number of semiconductor regions may be repeatedly arranged.

In an end portion of a region configuring an element (semiconductor element) having a function of a semiconductor device, a high-concentration p-type ($p^+$) SiC semiconductor region 16 is formed and arranged from a predetermined-level position above the surface of the ($n^-$) SiC semiconductor layer 12 to an inside of the ($n^-$) SiC semiconductor layer 12. For example, the ($p^+$) SiC semiconductor region 16 is arranged in the (n) SiC semiconductor layer 12 to have a depth equal to that of the ($p^+$) SiC semiconductor region 18. The ($p^+$) SiC semiconductor region 16 is an example of a fourth semiconductor region of the second conductivity type.

A high-concentration n-type ($n^+$) SiC semiconductor region 20 is selectively formed in at least a part of the ($p^-$) SiC semiconductor region 14 to range from the surface of the ($p^-$) SiC semiconductor region 14 to an inside of the ($p^-$) SiC semiconductor region 14. The ($n^+$) SiC semiconductor region 20 is an example of a third semiconductor region of the first conductivity type. In the example of FIG. 1, each ($n^+$) SiC semiconductor region 20 is arranged at a position which is not in contact with the ($p^+$) SiC semiconductor regions 18. In this case, each ($n^+$) SiC semiconductor region 20 is arranged at a center position of the ($p^-$) SiC semiconductor region 14 where the ($p^-$) SiC semiconductor regions 14 are left on both the sides. Each ($n^+$) SiC semiconductor region 20 is arranged to range from the surface of the ($p^-$) SiC semiconductor region 14 to a halfway position in the ($p^-$) SiC semiconductor region 14. Each ($n^+$) SiC semiconductor region 20 may be formed on the entire surface of the ($p^-$) SiC semiconductor region 14.

Anode electrodes 22 and 24 are selectively formed and arranged on the ($n^+$) SiC semiconductor region 20 and the ($p^+$) SiC semiconductor region 18 not to be in contact with the ($p^-$) SiC semiconductor region 14. Each of the anode electrodes 22 and 24 is an example of a first electrode. In the example of FIG. 1, since the surface of the ($n^+$) SiC semiconductor region 20 and the surface of the ($p^+$) SiC semiconductor region 18 are at substantially the same level, the anode electrodes 22 and 24 are formed at substantially the same level. The anode electrode 22 is formed on the ($n^+$) SiC semiconductor region 20 to configure an ohmic junction with the ($n^+$) SiC semiconductor region 20. The anode electrode 24 is formed on the ($p^+$) SiC semiconductor region 18 to configure an ohmic junction with the ($p^+$) SiC semiconductor region 18. A cathode electrode 26 is formed and arranged to be in contact with a rear surface (back surface) of the ($n^+$) SiC semiconductor substrate 10. The cathode electrode 26 is an example of a second electrode. The cathode electrode 26 is formed to configure an ohmic junction with the ($n^+$) SiC semiconductor substrate 10. The cathode electrode 26 is formed on the entire rear surface of the ($n^+$) SiC semiconductor substrate 10. A field dielectric film 30 is formed between the anode electrodes 22 and 24 and on the element end portion.

With the above configuration, in the semiconductor device according to the first embodiment, a Schottky substitute diode portion in which a current flows from the anode electrode 22 to the cathode electrode 26 and a PiN diode portion in which a current flows from the anode electrode 24 to the cathode electrode 26 are formed. In this manner, in the first embodiment, a diode using longitudinal transfer of a current between the front surface (upper surface) and the back surface (lower or rear surface) of the substrate is realized. The Schottky substitute diode portion substitutes for a Schottky barrier diode formed by Schottky-connecting a metal and a semiconductor to each other.

Figure 2A:
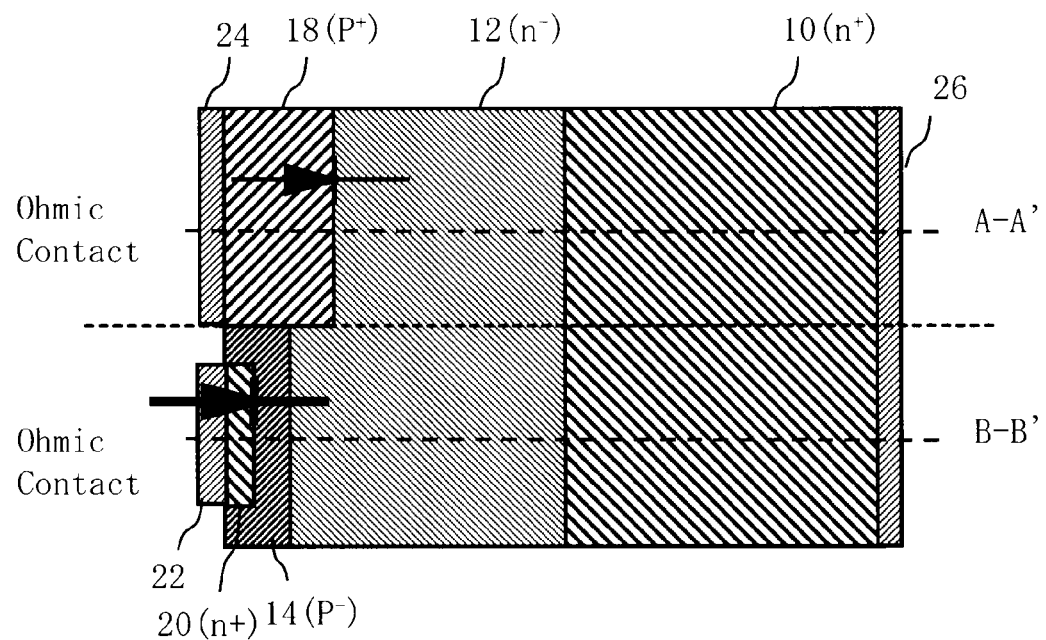
FIGS. 2A and 2B are diagrams showing a configuration of two diode portions in the first embodiment and relative energy bands therebetween.
Figure 2B:
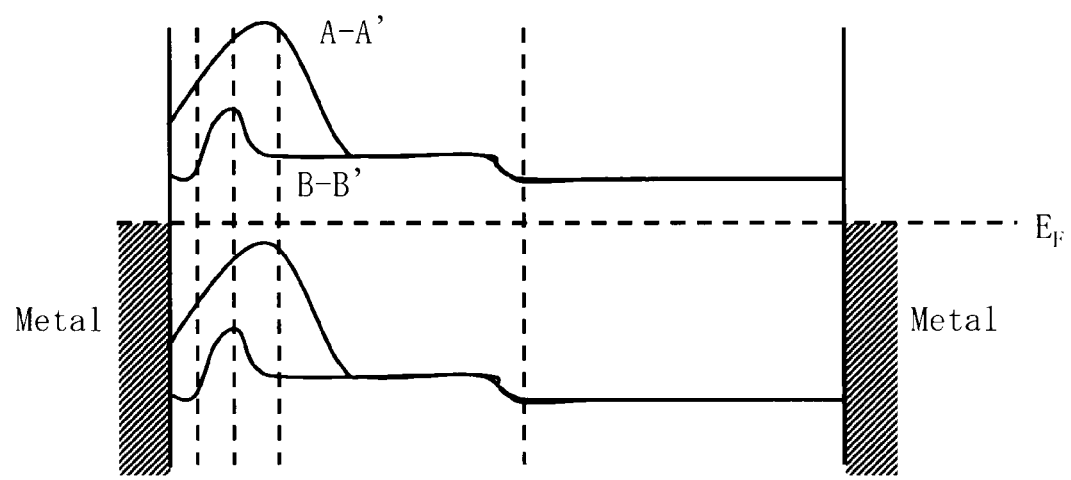

Relative energy bands of the two diode portions shown in FIG. 2A are shown in FIG. 2B. In FIGS. 2A and 2B, in a Schottky substitute diode portion (B-B'), as a forward direction, a current flows in a path going through the anode electrode 22, the ($n^+$) SiC semiconductor region 20, the ($p^-$) SiC semiconductor region 14, the ($n^-$) SiC semiconductor layer 12, the ($n^+$) SiC semiconductor substrate 10, and the cathode electrode 26 in this order. On the other hand, in a PiN diode portion (A-A'), as a forward direction, a current flows in a path going through the anode electrode 24, the ($p^+$) SiC semiconductor region 18, the (n⁻) SiC semiconductor layer 12, the (n⁺) SiC semiconductor substrate 10, and the cathode electrode 26 in this order.

When a voltage is applied such that the anode electrodes 22 and 24 are positive with respect to the cathode electrode 26, in the Schottky substitute diode portion, a current flows from the anode side to the cathode side over a relatively low energy barrier formed by a p⁻-type layer obtained by the ohmic junction and the (p⁻) SiC semiconductor region 14 (B-B' curve in FIG. 2B). The height of the energy barrier can be arbitrarily changed by changing an impurity concentration and/or a thickness h2 of the (p⁻) SiC semiconductor region 14. For this reason, a desired barrier energy and ON voltage can be controlled by design. In the PiN diode portion, holes begin to flow from a portion which is in ohmic contact with the p⁺-type layer by the (p⁺) SiC semiconductor region 18 when a voltage is higher than a voltage (=2.5 V) corresponding to a built-in potential in SiC. In a large-current region, when a voltage is a certain threshold voltage or more, a shift from unipolar to bipolar occurs, and a current controlled by a PN diode can be caused to flow. A concentration and a design width d of a p⁺-type layer are changed to make it possible to control a shift voltage.

In this case, in the configuration of FIG. 1, when a voltage is applied such that the cathode electrode 26 is positive with respect to the anode electrodes 22 and 24 (in a backward direction), a current easily flows in the Schottky substitute diode portion having a low barrier. However, in this case, a backward leakage current can be suppressed by a depletion layer spreading from the p⁺-type layer by a PN junction between a p⁺-type layer in the PiN diode portion and an n⁻-type layer obtained by the (n⁻) SiC semiconductor layer 12 serving as a drift layer.

Specifically, the semiconductor operates as follows. In the first embodiment, the diode is formed such that a distance from the rear surface of the anode electrodes 22 and 24 to the rear surface of the (p⁺) SiC semiconductor region 18 is larger than a distance from the rear surface of the anode electrodes 22 and 24 to the rear surface of the (p⁻) SiC semiconductor region 14. That is, the p⁺-type layer of the (p⁺) SiC semiconductor region 18 is arranged to a position deeper than that of the p⁻-type layer of the (p⁻) SiC semiconductor region 14. In this manner, the depletion layer extending from the p⁺-type layer can also be spread in a direction (direction lateral to the section of the semiconductor device in FIG. 1) perpendicular to a direction in which the anode electrodes 22 and 24 are connected to the cathode electrode 26. In other words, when a voltage is applied in a backward direction, the depletion layer from the p⁺-type layer can also be spread to the Schottky substitute diode portion side. Therefore, a backward leakage current can be suppressed.

In this case, (1) an extension length of the depletion layer can be determined by a difference between the impurity concentration of the (p⁺) SiC semiconductor region 18 and the impurity concentration of the (n⁻) SiC semiconductor layer 12 of the drift layer. (2) A length of a space in which the depletion layer needs to be present can be determined by an arrangement interval (pitch d) between the (p⁺) SiC semiconductor region 18 and the next (p⁺) SiC semiconductor region 18 adjacent thereto. (3) An amount of a flowing backward leakage current is determined by an impurity concentration and a thickness of the (p⁻) SiC semiconductor region 14. Therefore, the parameters of the items (1) to (3) are appropriately adjusted to make it possible to lower a rising voltage (ON voltage) in application of a forward voltage in a state in which a withstand voltage almost equal to that of a PN diode can be maintained in application of a backward voltage.

Therefore, in the first embodiment, a low loss can be achieved while maintaining the basic characteristics of a diode. In this manner, in the first embodiment, a low-loss device can be realized.

Figure 3:
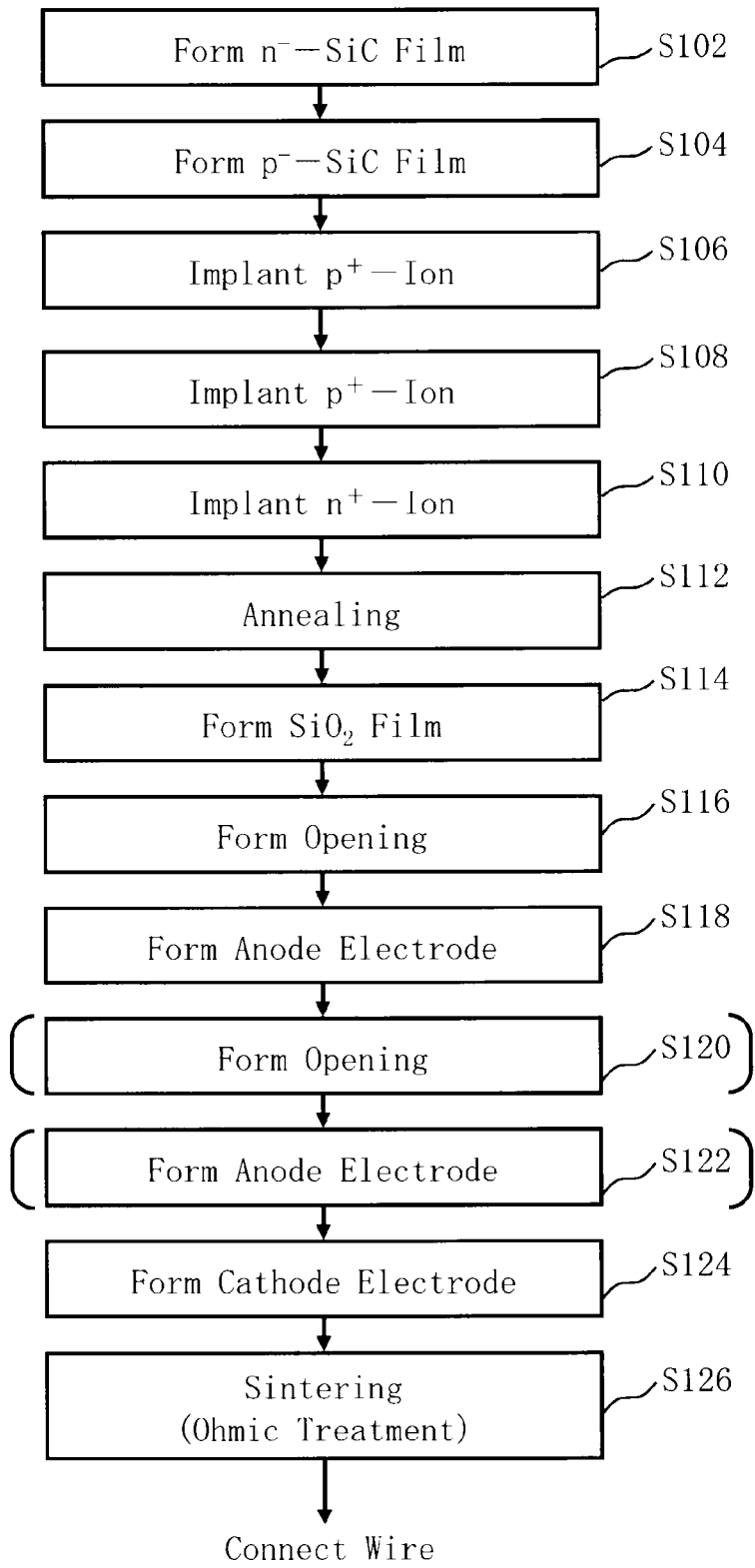
FIG. 3 is a flowchart showing a main part of a method for fabricating a semiconductor device in the first embodiment.

In FIG. 3, in the embodiment, a series of steps, i.e., a (n⁻) SiC film forming step (S102), a (p⁻) SiC film forming step (S104), a (p⁺) ion implantation step (S106), a (p⁺) ion implantation step (S108), an (n⁺) ion implantation step (S110), an annealing step (S112), a silicon oxide film (SiO₂ film) forming step (S114), an opening forming step (S116), an anode electrode forming step (S118), an opening forming step (S120), an anode electrode forming step (S122), a cathode electrode forming step (S124), and a sintering process step (S126) are performed. When the anode electrodes 22 and 24 are formed of the same material, of the above series of processes, the opening forming step (S120) and the anode electrode forming step (S122) can be omitted.

FIG. 4 shows the (n⁻) SiC film forming step (S102) to the (p⁺) ion implantation step (S108) in FIG. 3. Subsequent steps will be described later.

Figure 4A:
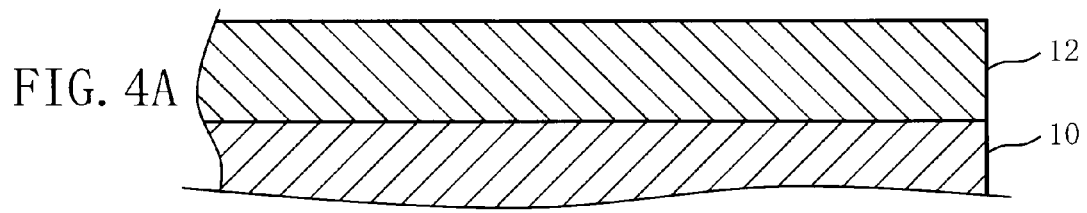
FIGS. 4A to 4D are sectional views showing steps executed in accordance with the flowchart of the fabricating method in the first embodiment.

In FIG. 4A, as the (n⁻) SiC film forming step (S102), the (n⁻) SiC semiconductor layer 12 is formed on the surface (front surface) of the (n⁺) SiC semiconductor substrate 10. As the (n⁺) SiC semiconductor substrate 10, for example, a solid-state single-crystal SiC substrate is used. An impurity concentration (doping concentration) in the (n⁺) SiC semiconductor substrate 10 is preferably $1 \times 10^{18}$ atom/cm³ or more and lower than $1 \times 10^{20}$ atom/cm³. For example, a substrate formed at $1 \times 10^{18}$ atom/cm³ is used in this case. The (n⁻) SiC semiconductor layer 12 is formed by epitaxially growing an (n⁻) SiC film on the surface of the (n⁺) SiC semiconductor substrate 10 by an epitaxial vapor-phase growth. Depending on an element withstand voltage range (described later), the impurity concentration of the (n⁻) SiC semiconductor layer 12 is preferably $8 \times 10^{14}$ atom/cm³ or more and lower than $1 \times 10^{17}$ atom/cm³. Similarly, depending on an element withstand voltage range (described later), a film thickness of the (n⁻) SiC semiconductor layer 12 preferably ranges from 5 μm to 100 μm. Another buffer layer (not shown) may be present between the (n⁺) SiC semiconductor substrate 10 and the (n⁻) SiC semiconductor layer 12.

Figure 4B:
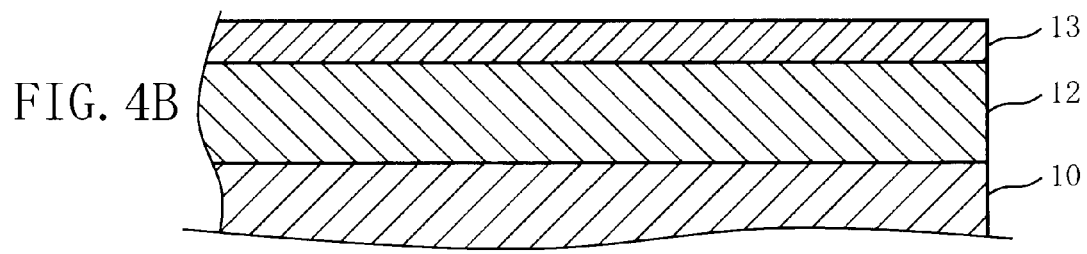

In FIG. 4B, as the (p⁻) SiC film forming step (S104), a (p⁻) SiC semiconductor layer 13 to form the (p⁻) SiC semiconductor region 14 is formed on the (n⁻) SiC semiconductor layer 12. The (p⁻) SiC semiconductor layer 13 is formed by epitaxially growing a (p⁻) SiC semiconductor layer by the epitaxial vapor-phase growth subsequently to the (n⁻) SiC semiconductor layer 12 formed by the epitaxial growth. As an impurity, for example, aluminum or boron is preferably used. The method of forming the (p⁻) SiC semiconductor layer 13 is not limited to the epitaxial vapor-phase growth. For example, an impurity (p⁻) may be doped from the surface of the (n⁻) SiC semiconductor layer 12 by an ion implantation method to a predetermined depth. An impurity concentration of the (p⁻) SiC semiconductor layer 13 is preferably $5 \times 10^{16}$ atom/cm³ or more and lower than $5 \times 10^{17}$ atom/cm³. A film thickness of the (p⁻) SiC semiconductor layer 13 preferably ranges from 10 nm to 500 nm. The impurity concentration of the (p⁻) SiC semiconductor layer 13 is suppressed to a low level to make it possible to suppress an energy barrier height to a low level in application of a forward voltage. Similarly, the thickness of the (p⁻) SiC semiconductor layer 13 is decreased to make it possible to suppress an energy barrier height to a low level in application of a forward voltage. However, since an energy barrier height in the Schottky substitute diode portion is influenced not only by the impurity concentration and the thickness of the (p⁻) SiC semiconductor layer 13 ((p⁻) SiC semiconductor region 14) but also by the impurity concentration of the (n⁻) SiC semiconductor layer 12 to be connected, it is desired to appropriately adjust the three parameters including the impurity concentration of the (n⁻) SiC semiconductor layer 12.

Figure 4C:
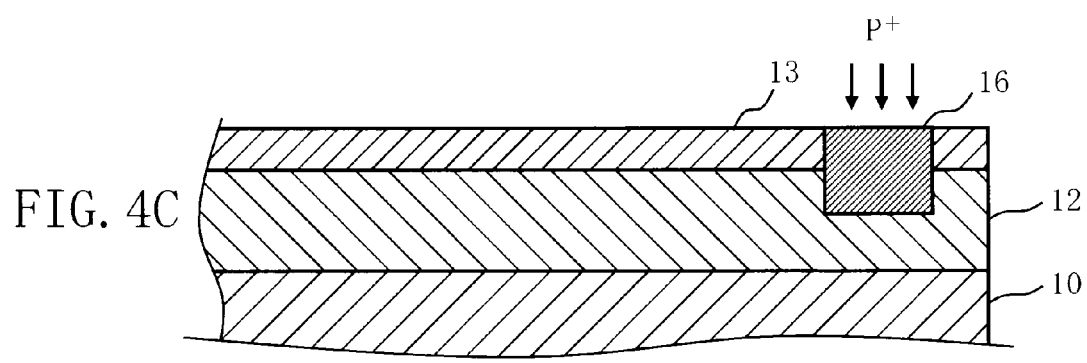

In FIG. 4C, as the (p⁺) ion implantation step (S106), ion implantation in a p-layer serving as an end structure of the semiconductor element is performed to form the (p⁺) SiC semiconductor region 16. The end structure is preferably designed according to a withstand voltage range. A (p⁺) layer serving as a JTE is formed as an example here. An impurity concentration thereof is preferably $5 \times 10^{17}$ atom/cm³ or more and lower than $5 \times 10^{18}$ atom/cm³. A film thickness of the (p⁺) SiC semiconductor region 16 preferably ranges from 0.3 µm to 0.6 µm. In this case, the (p⁺) SiC semiconductor region 16 is formed to range from the surface of the (p⁻) SiC semiconductor layer 13 to the inside of the (n⁻) SiC semiconductor layer 12. The ion implantation may be performed by using an oxide film, another dielectric film, a metal film, a resist film, or the like as a mask. At a room temperature, the ion implantation is most easily performed by using the resist.

Figure 4D:
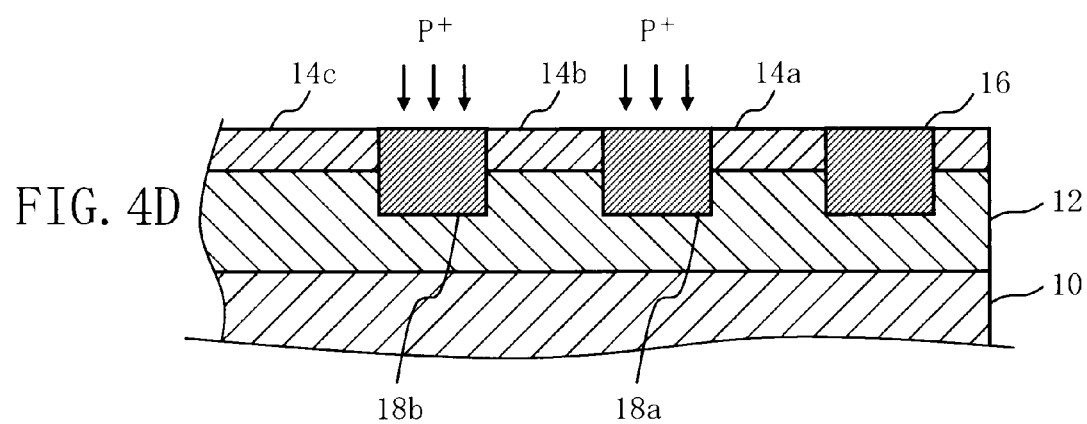

In FIG. 4D, as the (p⁺) ion implantation step (S108), ion implantation is performed in a region serving as a part of the (p⁻) SiC semiconductor layer 13 such that an impurity serving as (p⁺) is implanted from the surface of the (p⁻) SiC semiconductor layer 13 to the inside of the (n⁻) SiC semiconductor layer 12. As the impurity, for example, aluminum is preferably used. In this manner, the plurality of (p⁺) SiC semiconductor regions 18a and 18b are selectively formed. When the (p⁺) SiC semiconductor region 18 is selectively formed, the (p⁻) SiC semiconductor layer 13 is divided, and the plurality of (p⁻) SiC semiconductor regions 14a, 14b, and 14c are selectively formed in a region in which (p⁺) impurity ions are not implanted. In this manner, the (p⁺) SiC semiconductor region 18 and the (p⁻) SiC semiconductor region 14 are alternately and repeatedly formed. In the first embodiment, for example, ion implantation is performed such that the (p⁺) SiC semiconductor region 18 and the (p⁻) SiC semiconductor region 14 have a region width ratio of 1:1.

Since the (p⁺) SiC semiconductor region 18 and the anode electrode 24 form an ohmic junction, impurity ion implantation is ideally performed at a higher concentration to realize a low ohmic resistance. However, in SiC ion implantation, when an impurity concentration is excessively high, a high-resistance layer may be formed due to a damage layer. For this reason, the impurity concentration of the (p⁺) SiC semiconductor region 18 is preferably $1 \times 10^{18}$ atom/cm³ or more and lower than $1 \times 10^{20}$ atom/cm³. A film thickness of the (p⁺) SiC semiconductor region 18 preferably ranges from 0.3 µm to 1 µm. In this case, as an example, the (p⁺) SiC semiconductor region 18 is formed to have the same thickness as the (p⁺) SiC semiconductor region 16. The (p⁺) SiC semiconductor region 18 is desirably formed to have a depth sufficiently larger than that of the (p⁻) SiC semiconductor region 14. The ion implantation may be performed by using an oxide film, another dielectric film, a metal film, a resist film, or the like as a mask. At a room temperature, the ion implantation is most easily performed by using the resist.

In this case, when the (p⁺) SiC semiconductor region 18 and the (p⁺) SiC semiconductor region 16 can have the same impurity concentration and the same depth without any problem, ion implantation may be performed to both the regions at once. Therefore, in this case, one of the (p⁺) ion implantation step (S106) and the (p⁺) ion implantation step (S108) can be omitted.

FIG. 5 shows the (n⁺) ion implantation step (S110) to the opening forming step (S116) in FIG. 3. Subsequent steps will be described later.

Figure 5A:
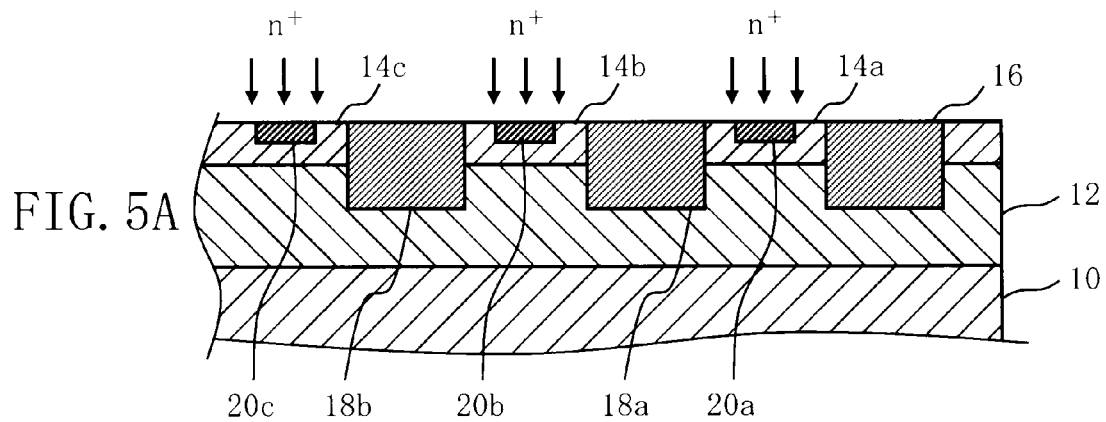
FIGS. 5A to 5C are sectional views showing steps executed in accordance with the flowchart of the fabricating method according to the first embodiment.

In FIG. 5A, as the (n⁺) ion implantation step (S110), (n⁺) impurity ions are implanted in a region of a part of the (p⁻) SiC semiconductor region 14 to range from the surface of the (p⁻) SiC semiconductor region 14 to an inside of the (p⁻) SiC semiconductor region 14. As the impurity, for example, phosphorous is preferably used. In this manner, the (n⁺) SiC semiconductor region 20 is formed in a part of each of the (p⁻) SiC semiconductor regions 14 to range from the surface of the (p⁻) SiC semiconductor region 14 to an inside of the (p⁻) SiC semiconductor region 14. In this manner, the plurality of (n⁺) SiC semiconductor regions 20a, 20b, and 20c are selectively formed. In this case, impurity ions are implanted in a center portion of an exposed surface of each of the (p⁻) SiC semiconductor regions 14. In this manner, a gap can be formed between the (n⁺) SiC semiconductor region 20 and the (p⁺) SiC semiconductor region 18. Since the (n⁺) SiC semiconductor region 20 is formed to form an ohmic junction with the anode electrode 22, the thickness of the (n⁺) SiC semiconductor region 20 may be small. A film thickness of the (n⁺) SiC semiconductor region 20 preferably ranges from several micrometers to 0.3 µm. The ion implantation may be performed by using an oxide film, another dielectric film, a metal film, a resist film, or the like as a mask. At a room temperature, the ion implantation is most easily performed by using the resist.

In the (n⁺) ion implantation step (S110), a channel stopper layer serving as an n⁺-type layer (not shown) is preferably formed at the same time.

As the annealing step (S112), after the end of all the ion implantation, activation annealing is performed. An activation annealing temperature preferably ranges from about 1500° C. to 2000° C. In particular, in high-temperature annealing, an SiC surface may be sublimed. For this reason, the annealing treatment is desirably performed with a measure to prevent the surface from being sublimed.

Figure 5B:
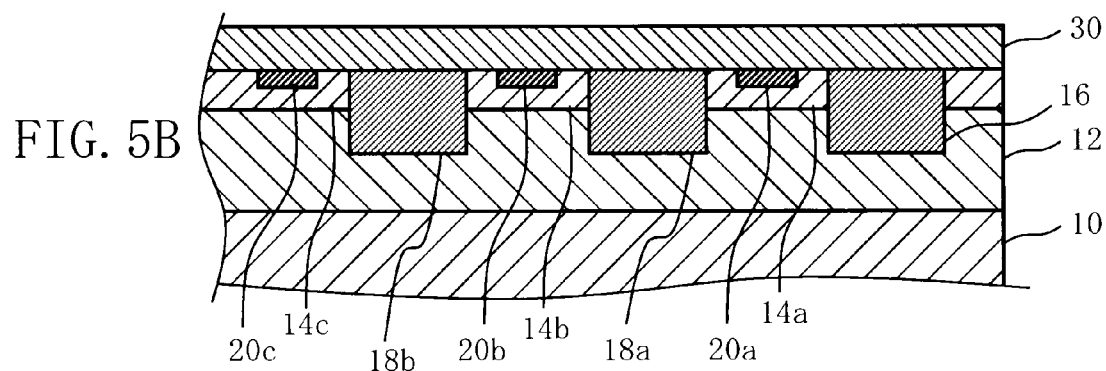

In FIG. 5B, as the SiO₂ film forming step (S114), the field dielectric film 30 is formed on the entire surface of the substrate. The field dielectric film 30 is preferably an SiO₂ film. Not only the oxide film, but also a nitride film or the like may be applied. The field dielectric film may be formed by oxidizing the exposed SiC surface or laminating an SiO₂ film by chemical vapor deposition (CVD).

Figure 5C:
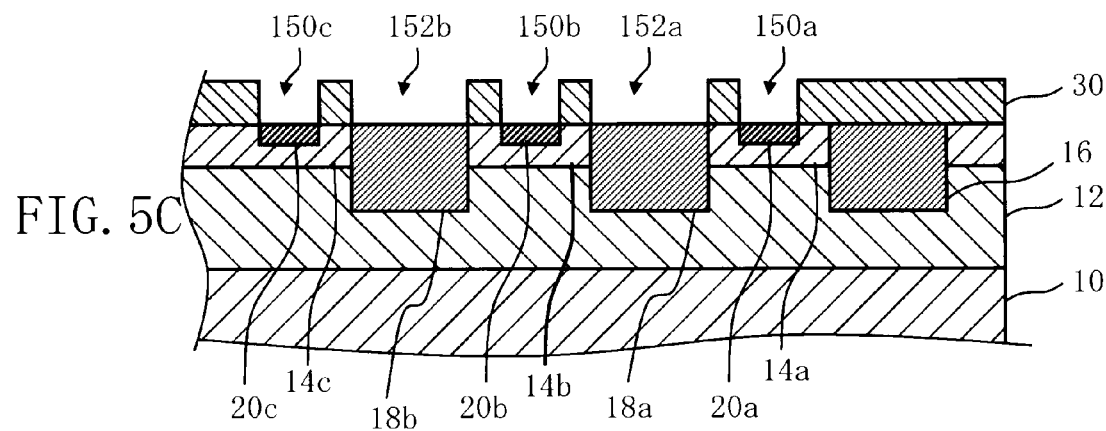

In FIG. 5C, as the opening forming step (S116), the field dielectric film 30 is selectively etched to expose the surface of the (n⁺) SiC semiconductor region 20 and the surface of the (p⁺) SiC semiconductor region 18 to thereby form openings 150 and 152. The openings 150 and 152 are formed in the field dielectric film 30 by a lithography step and a dry etching step. The exposed field dielectric film 30 is removed by an anisotropic etching method from a substrate in which a resist film is formed on the field dielectric film 30 through lithography steps (not shown) such as a resist applying step and an exposing step, so that the openings 150 and 152 can be formed substantially perpendicularly to the surface of the substrate. For example, the openings 150 and 152 may be formed by a reactive ion etching method.

FIG. 6 shows the anode electrode forming step (S118) to the cathode electrode forming step (S124) in FIG. 3.

Figure 6A:
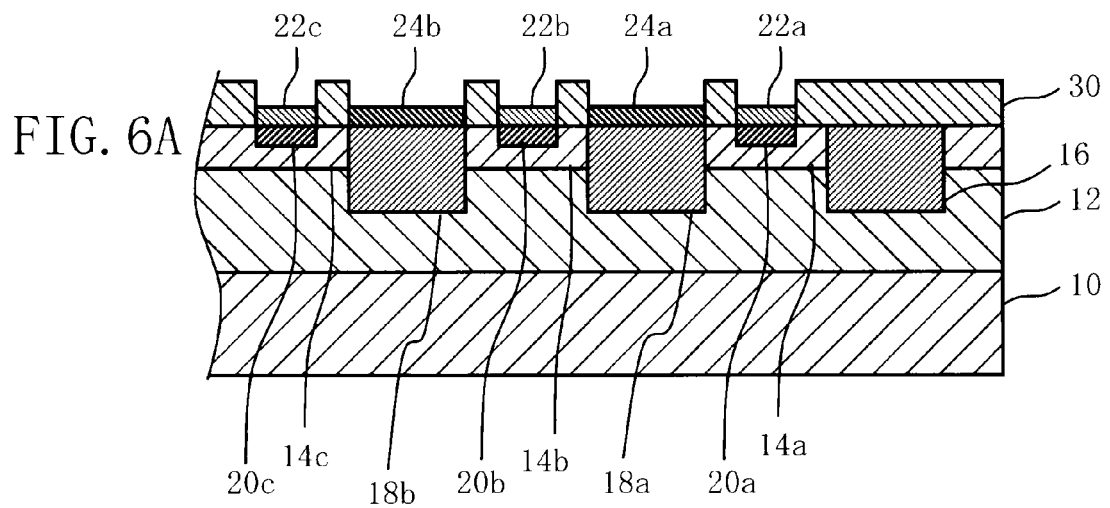
FIGS. 6A and 6B are sectional views showing steps executed in accordance with the flowchart of the fabricating method according to the first embodiment.

In FIG. 6A, as the anode electrode forming step (S118), the anode electrode 22 is formed on the (n⁺) SiC semiconductor region 20 serving as a part on the (p⁻) SiC semiconductor region 14, and the anode electrode 24 is formed on the (p⁺) SiC semiconductor region 18. For example, the anode electrodes 22 and 24 are formed of the same material. For this reason, the opening 150 for the anode electrode 22 and the opening 152 for the anode electrode 24 are simultaneously formed in the opening forming step (S116). Anode electrode materials are simultaneously buried in the openings 150 and 152. As the materials of the anode electrodes 22 and 24, for example, nickel (Ni) is preferably used.

Ni is preferably in ohmic contact with the $n^+$-type layer. On the other hand, a titanium (Ti)/aluminum (Al) alloy, Al, Ni, or the like is preferably in ohmic contact with the $p^+$-type layer. When different materials are used for the anode electrodes 22 and 24, for example, the opening 150 is formed at the opening forming step (S116), and a film formed of Ni is formed in the opening 150 at the anode electrode forming step (S118). Thereafter, the opening 152 is formed at the opening forming step (S120), and a film formed of a titanium (Ti)/aluminum (Al) alloy or Al is formed in the opening 152 at the anode electrode forming step (S122). The order may be reversed.

Figure 6B:
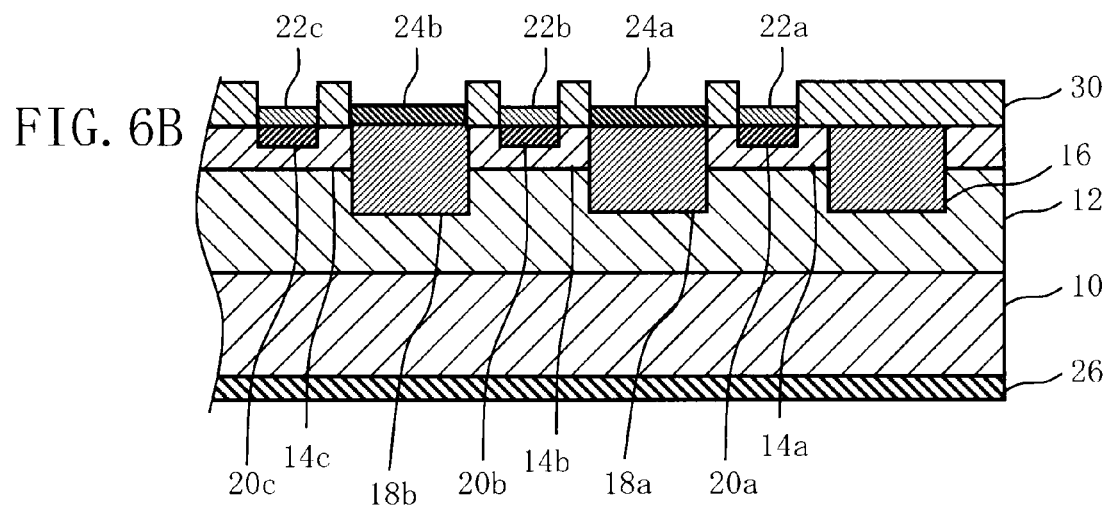

In FIG. 6B, as the cathode electrode forming step (S124), the cathode electrode 26 is formed on the rear surface of the $(n^+)$ SiC semiconductor substrate 10. Since the $(n^+)$ SiC semiconductor substrate 10 is also an $n^+$-type layer, Ni is desirably in ohmic contact with the $(n^+)$ SiC semiconductor substrate 10. For this reason, Ni is preferably used as a material of the cathode electrode 26.

As the sintering process step (S126), the substrate is heated (sintering process) at about 1000° C. In this manner, Ni serving as an electrode material can be silicided to make an ohmic contact. More specifically, the $(n^+)$ SiC semiconductor region 20 and the anode electrode 22 are in ohmic contact with each other. Similarly, the $(p^+)$ SiC semiconductor region 18 and the anode electrode 24 are in ohmic contact with each other. Similarly, the $(n^+)$ SiC semiconductor substrate 10 and the cathode electrode 26 are in ohmic contact with each other. As a result, a low-resistance junction can be formed. At present, it is known that a layer which is sintered at 1000° C. by an Ni electrode is suitable for an $n^+$-type layer formed at a high impurity concentration because the layer has the lowest resistance. However, when the impurity concentration of the $n^+$-type layer is high, the treatment may be performed at a temperature lower than 1000° C.

As described above, the steps are executed to make it possible to form the semiconductor device shown in FIG. 1. Thereafter, pad electrodes (not shown) on the surface and on a rear surface are formed to complete a semiconductor element. The pad electrode is fabricated in accordance with packages on the upper and lower surfaces. When Al wire bonding is performed on the upper side, the pad electrodes are formed of Al. When mounting is performed with soldering on the lower side, the pad electrodes are generally formed of Ti/Ni/palladium (Pd)/gold (Au) or the like.

As described above, in the semiconductor device according to the first embodiment, a low loss can be achieved while maintaining the basic characteristics of a diode.

The embodiment has been described with reference to the concrete examples. However, the present invention is not limited to the concrete examples. In the above embodiment, SiC is used as a series of semiconductor materials. However, the semiconductor materials are not limited to SiC. For example, even when silicon (Si), gallium nitride (GaN), diamond, or the like is used as a series of semiconductor materials, the same effect as described above can be obtained.

The film thickness of each layer (film), and the size, the shape and the number of openings can be appropriately selected and used from those required for a semiconductor integrated circuit and various semiconductor elements.

In addition, all methods for fabricating a semiconductor device which include the elements of the present invention and can be obtained by appropriately change of design by a person skilled in the art are included in the spirit and scope of the invention.

While techniques normally used in the semiconductor industry such as a photolithography process and cleaning before and after treatment are not described for convenience of description, it is needless to say that such techniques are included in the scope of the present invention.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate of a first conductivity type;
   a first semiconductor layer of the first conductivity type formed on the semiconductor substrate;
   a first semiconductor region of a second conductivity type selectively formed on at least a part of the first semiconductor layer;
   a second semiconductor region of the second conductivity type formed on another part of the first semiconductor layer to reach an inside of the first semiconductor layer and having an impurity concentration higher than that of the first semiconductor region;
   a third semiconductor region of the first conductivity type formed in a part of the first semiconductor region to range from a surface of the first semiconductor region to an inside of the first semiconductor region;
   a first electrode formed to be in contact with the second and third semiconductor regions and not to be in contact with the first semiconductor region; and
   a second electrode formed to be in contact with a rear surface of the semiconductor substrate,
   wherein the first semiconductor region does not overlap a bottom surface of the second semiconductor region, the first semiconductor region is arranged on the first semiconductor layer not via a semiconductor region of the second conductivity type and is located adjacent to the second semiconductor region, and the third semiconductor region is not in contact with the second semiconductor region.

2. The device according to claim 1, wherein a distance from a rear surface of the first electrode to a rear surface of the second semiconductor region is longer than a distance from the rear surface of the first electrode to a rear surface of the first semiconductor region.

3. The device according to claim 1, wherein the first and second semiconductor regions are alternately and repeatedly arranged.

4. The device according to claim 1, wherein an impurity concentration of the second semiconductor region is $1\times10^{18}$ atom/cm$^3$ or more and lower than $1\times10^{20}$ atom/cm$^3$.

5. The device according to claim 1, further comprising a fourth semiconductor region of the second conductivity type arranged at an end portion of a region configuring an semiconductor element.

6. The device according to claim 1, wherein, as a material of the semiconductor substrate, any one of silicon carbide, gallium nitride, and diamond is used.

7. The device according to claim 1, wherein a first diode is formed by using the first electrode, the second semiconductor region, the first semiconductor layer, the semiconductor substrate, and the second electrode.

8. The device according to claim 7, wherein the first diode causes a current to flow from the first electrode to the second semiconductor region, the first semiconductor layer, the semiconductor substrate, and the second electrode in this order.

9. The device according to claim 7, wherein a second diode is formed by using the first electrode, the third semiconductor region, the first semiconductor region, the first semiconductor layer, the semiconductor substrate, and the second electrode.

10. The device according to claim 9, wherein the second diode causes a current to flow from the first electrode to the third semiconductor region, the first semiconductor region, the first semiconductor layer, the semiconductor substrate, and the second electrode in this order.

11. The device according to claim 9, wherein the first and second diodes are alternately and repeatedly arranged.

12. The device according to claim 9, wherein a thickness of the first semiconductor layer in the first diode is smaller than a thickness of the first semiconductor layer in the second diode.

13. The device according to claim 9, wherein the second semiconductor region in the first diode is formed to have a film thickness larger than that of the first semiconductor region in the second diode.

14. The device according to claim 9, wherein a surface of the second semiconductor region in the first diode and a surface of the third semiconductor region in the second diode are formed at substantially the same level position.

15. The device according to claim 1, wherein the first electrode and the second semiconductor region form an ohmic junction.

16. The device according to claim 15, wherein the first electrode and the third semiconductor region form an ohmic junction.

* * * * *